US011697706B2

(12) United States Patent
Lund et al.

(10) Patent No.: US 11,697,706 B2
(45) Date of Patent: *Jul. 11, 2023

(54) SEALED ISOCYANATES

(71) Applicants: Adaptive 3D Technologies, Plano, TX (US); Board of Regents, The University of Texas System, Austin, TX (US)

(72) Inventors: Benjamin R. Lund, Plano, TX (US); Walter Voit, Richardson, TX (US)

(73) Assignees: Adaptive 3D Technologies, Plano, TX (US); Board of Regents, The University of Texas System, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/049,046

(22) PCT Filed: Apr. 19, 2019

(86) PCT No.: PCT/US2019/028382
§ 371 (c)(1),
(2) Date: Oct. 20, 2020

(87) PCT Pub. No.: WO2019/204770
PCT Pub. Date: Oct. 24, 2019

(65) Prior Publication Data
US 2021/0189033 A1 Jun. 24, 2021

Related U.S. Application Data

(60) Provisional application No. 62/660,894, filed on Apr. 20, 2018.

(51) Int. Cl.
| | | |
|---|---|---|
| *C08G 18/80* | (2006.01) | |
| *B33Y 10/00* | (2015.01) | |
| *B33Y 70/00* | (2020.01) | |
| *B29C 64/153* | (2017.01) | |
| *C08G 18/38* | (2006.01) | |
| *C08G 18/67* | (2006.01) | |
| *C08F 220/12* | (2006.01) | |

(52) U.S. Cl.
CPC ............ *C08G 18/80* (2013.01); *B29C 64/153* (2017.08); *B33Y 10/00* (2014.12); *B33Y 70/00* (2014.12); *C08F 220/12* (2013.01); *C08G 18/3855* (2013.01); *C08G 18/672* (2013.01)

(58) Field of Classification Search
CPC .. G03F 7/0037; C08J 3/28; C08J 3/24; C08G 18/80; C08G 18/672; C08G 18/2744; C08F 220/12; B33Y 70/00; B33Y 10/00; B29C 64/153
See application file for complete search history.

(56) References Cited

U.S. PATENT DOCUMENTS

| | | |
|---|---|---|
| 5,496,919 A | 3/1996 | Nakano |
| 6,472,451 B2 | 10/2002 | Ha et al. |
| 6,506,814 B2 | 1/2003 | Krongauz et al. |
| 6,555,596 B1 | 4/2003 | Pourreau et al. |
| 7,060,762 B2 | 6/2006 | Schaedler et al. |
| 7,893,127 B2 | 2/2011 | Nagvekar et al. |
| 8,846,777 B2 | 9/2014 | Bowman et al. |
| 8,883,392 B2 | 11/2014 | Napadensky et al. |
| 8,921,446 B2 | 12/2014 | Nakatani et al. |
| 9,303,123 B2 | 4/2016 | Kurata et al. |
| 9,296,933 B2 | 5/2016 | Sherman et al. |
| 9,534,151 B2 | 1/2017 | Fujimoto et al. |
| 9,559,073 B2 | 1/2017 | Tamura et al. |
| 9,623,268 B2 | 4/2017 | Cooke et al. |
| 2002/0037944 A1 | 3/2002 | Shen et al. |
| 2006/0025492 A1 | 2/2006 | Chauk |
| 2007/0261602 A1 | 11/2007 | Verborgt et al. |
| 2008/0289539 A1 | 11/2008 | Tazzia |
| 2009/0169872 A1 | 7/2009 | Krongauz et al. |
| 2010/0171393 A1 | 7/2010 | Pei et al. |
| 2011/0195237 A1 | 8/2011 | Patel et al. |
| 2011/0201717 A1 | 8/2011 | Held et al. |
| 2012/0157564 A1 | 6/2012 | Kurata |
| 2012/0202909 A1 | 8/2012 | Chen |
| 2012/0259031 A1 | 10/2012 | Dake et al. |
| 2016/0024331 A1 | 1/2016 | Catena |
| 2017/0022414 A1 | 1/2017 | Boogaerts et al. |
| 2017/0066936 A1 | 3/2017 | Lee et al. |
| 2017/0184959 A1 | 6/2017 | Honma et al. |
| 2017/0253780 A1 | 9/2017 | Wang et al. |
| 2017/0275430 A1 | 9/2017 | Kube et al. |
| 2017/0291357 A1 | 10/2017 | Fong et al. |
| 2020/0332066 A1* | 10/2020 | Kao ...................... B33Y 70/00 |
| 2021/0079155 A1 | 3/2021 | Lund et al. |
| 2021/0087328 A1 | 3/2021 | Lund et al. |

FOREIGN PATENT DOCUMENTS

| | | |
|---|---|---|
| CN | 102746785 A | 10/2012 |
| EP | 2 878 613 A1 | 6/2015 |
| JP | 2009185182 A | 8/2009 |
| JP | 2014005260 A | 1/2014 |
| JP | 5475067 B2 | 4/2014 |
| WO | WO 2017/109497 A1 | 6/2017 |
| WO | WO 2017/112483 A2 | 6/2017 |
| WO | WO 2017/112521 A1 | 6/2017 |
| WO | WO 2017/151782 A1 | 9/2017 |

OTHER PUBLICATIONS

Wikipedia contributors. (Jan. 13, 2022). Elastomer. In Wikipedia, The Free Encyclopedia. Retrieved 19:44, May 17, 2022, from https://en.wikipedia.org/w/index.php?title=Elastomer&oldid= 1065502393 (Year: 2022).*

(Continued)

*Primary Examiner* — Sanza L. McClendon
(74) *Attorney, Agent, or Firm* — Finnegan, Henderson, Farabow, Garrett & Dunner, LLP

(57) ABSTRACT

The present disclosure relates to sealed isocyanate resin compositions. The resin compositions may be used for additive manufacturing. One embodiment of the invention includes a photopolymerizable resin for additive manufacturing, the resin comprising: a blocked isocyanate; at least one monomer or oligomer; and a multifunctional nucleophile.

16 Claims, No Drawings

(56) References Cited

OTHER PUBLICATIONS

Bayer MaterialScience, "The Chemistry of Polyurethane Coatings," 31 pages.
Cheng et al., "Surface functionalization of 3D-printed plastics via initiated chemical vapor deposition," Beilstein J Nanotechnol., 8:1629-1636 (2017).
Fouassier et al., "Dyes as photoinitiators or photosensitizers of polymerization reactions." Materials 3(12): 5130-5142 (2010).
Hoyle et al., "Thiol-enes: Chemistry of the past with promise for the future," Journal of Polymer Science: Part A: Polymer Chemistry 42(21): 5301-5338 (2004).
Hoyle et al., "Thiol-click chemistry: a multifaceted toolbox for small molecule and polymer synthesis," Chem. Soc. Rev., 39:1355-1387 (2010).
International Search Report for PCT/US2019/028382, dated Aug. 6, 2019.
Jin et al., "Kinetics of multifunctional thiol-epoxy click reactions studied by differential scanning calorimetry: effects of catalysis and functionality," Polymer 81: 70-78 (2015).
Koo et al., "Limitations of radical thiol-ene reactions for polymer-polymer conjugation," Journal of Polymer Science Part A: Polymer Chemistry 48(8): 1699-1713 (2010).
Leonards et al., "Advantages and drawbacks of Thiol-ene based resins for 3D-printing," *Laser 3D Manufacturing II.* vol. 9353. International Society for Optics and Photonics (2015).
Leonards et al., "Stereolithographic Processing and Biocompatibility of a Thiol-ene Based Resin."
Li et al., "The effect of thiol and ene structures on thiol-ene networks: Photopolymerization, physical, mechanical and optical properties," Polymer 50(10): 2237-2245 (2009).
Ligon et al., "Advanced applications of thiol-ene formulations" 2014 UV & EB Technical Conference Proceedings (2014).
Ligon et al., "Strategies to reduce oxygen inhibition in photoinduced polymerization." Chemical Reviews 114(1): 557-589 (2014).
Lowe, "Thiol-ene 'click' reactions and recent applications in polymer and materials synthesis," Polymer Chemistry 1(1): 17-36 (2010).
Matsushima et al., "Thiol-Isocyanate-Acrylate Ternary Networks by Selective Thiol-Click Chemistry," Journal of Polymer Science: Part A: Polymer Chemistry, 48:3255-3264 (2010).
Murofushi, "The characteristic of the secondary thiol compounds and its application." Corporate R&D Center, Showa Denko K.K., Kawasaki, Japan.
Nakayama et al., "Synthesis of novel UV-curable difunctional thiourethane methacrylate and studies on organic-inorganic nanocomposite hard coatings for high refractive index plastic lenses," Progress in Organic Coatings 62:274-284 (2008).
Northrop et al., "Thiol-ene click chemistry: computational and kinetic analysis of the influence of alkene functionality," Journal of the American Chemical Society 134(33): 13804-13817 (2012).
Pfeifer et al., "Delayed gelation through chain-transfer reactions: Mechanism for stress reduction in methacrylate networks," 52(15): 3295-3303, (2011).
Querat et al., "Blocked isyocyanate: Reaction and thermal behaviour of the toluene 2,4-diisocyanate dimer," Die Angewandte Makromolekulare Chemie, 242:1-36, (1996).
Rolph et al., "Blocked isocyanates: from analytical and experimental considerations to non-polyurethane applications," Poly. Chem., 7:7351-7364, (2016).
Rogulska et al., "New thermoplastic poly(thiourethane-urethane) elastomers based on hexane-1,6-diyl diisocyanate (HDI)," J Therm Anal Calorim, 114:903-916 (2013).
Sharmin et al., "Polyurethane: an introduction," Polyurethane: 3-16 (2012).
Wicks et al., "Blocked isocyanates III: Part A. Mechanisms and chemistry," Progress in Organic Coatings, 36:148-172, (1999).
Wicks et al., "Blocked isocyanates III: Part B. Uses and applications of blocked isocyanates," Progress in Organic Coatings, 41:1-83, (2001).
Written Opinion of the International Searching Authority for PCT/US2019/028382, dated Aug. 6, 2019.
Yao et al., "Kinetics based on the base-catalyzed mechanism of a click reaction between glycol dimercaptoacetate and glycidyl phenyl ether," *RSC advances* 7(18): 10881-10884 (2017).
Non-Final Office Action in related U.S. Appl. No. 17/104,021, dated Dec. 21, 2021.
Non-Final Office Action in related U.S. Appl. No. 17/104,034, dated Dec. 21, 2021.
Extended European Search Report for EP Application No. 19787909.1-1010, dated Aug. 31, 2021, 8 pages.

* cited by examiner

SEALED ISOCYANATES

CROSS-REFERENCE TO RELATED APPLICATIONS

This application is a national stage filing under 35 U.S.C. § 371 of International Application No. PCT/US19/28382, filed on Apr. 19, 2019, which claims priority to U.S. Provisional Application No. 62/660,894, filed Apr. 20, 2018, the contents of which are incorporated herein by reference.

FIELD OF INVENTION

This invention is related generally to the field of additive manufacturing, and more particularly to three-dimensional (3D) printing materials, methods, and articles made therefrom.

BACKGROUND

This application discloses sealed isocyanate compositions. The compositions described herein can be used with any of the embodiments discussed, described, shown or claimed in U.S. Provisional Patent Application No. 62/649,130 ("'130 application") or in PCT international Application No. PCT/US2019/24704. The full disclosures of these applications are incorporated herein by reference.

Many polymeric thermoplastic materials are high molecular weight, semi-crystalline polymers. These materials are 3D printable by additive manufacturing techniques such as Fused Filament Fabrication (FFF) and Selective Laser Sintering (SLS). However, resin-based techniques (such as Digital Light Projection (DLP), Stereolithography (SL) and polymer jetting) have been limited in their ability to produce these materials due to the constraints of the printing process.

Additive manufacturing or 3D printing refers to the process of fabricating 3D objects by selectively depositing material layer-by-layer under computer control. One category of additive manufacturing processes is vat photopolymerization in which 3D objects are fabricated from liquid photopolymerizable resins by sequentially applying and selectively curing a liquid photopolymerizable resin using light, for example ultraviolet, visible or infrared radiation. In some cases, thiol-ene resins may be used in these 3D printing processes.

Thiol-ene resins polymerize by reaction between mercapto compounds (—SH, "thiol") with a C=C double bond, often from a (meth-) acrylate, vinyl, allyl or norbornene functional group, of the "ene" compound. For photo- initiated thiol-ene systems, the reaction follows a radical addition of thiyl-radical to an electron rich or electron poor double bond. The nature of the double bond may contribute to the speed of the reaction. The reaction steps of the radical-initiated, chain-transfer, step-growth thiol-ene polymerization may proceed as follows: a thiyl radical is formed through the abstraction of a hydrogen radical; the thiyl radical reacts with a double bond, cleaving it, and forms a radical intermediate of the β-carbon of the "ene"; this carbon radical then abstracts a proton radical from an adjacent thiol, through a chain transfer, reinitiating the reaction which propagates until all reactants are consumed or trapped. In the case of di- and polyfunctional thiols and ones, a polymer chain or polymer network is formed via radical step growth mechanisms. Thiol-ene polymerizations can react either by a radical transfer from a photoinitiator or by direct spontaneous trigger with UV-irradiation (nucleophilic Michael additions are also possible between unstabilized thiols and reactive ones).

In some cases, challenges may be encountered in the development of thermoplastic-like materials in resin-based 3D printing technologies: crosslink density and crystallinity. One problem that may be encountered is that not all resins have a high crosslink density. Resin based 3D printing techniques operate by causing a resin to gel and then fully cure (harden) by the exposure of the resin to light and sometimes the application of heat in a post baking step. To form a gel, the resin must become sufficiently viscous through increases in molecular weight. This gelation requires a minimum amount of crosslinks (chemical or physical) to be formed between neighboring polymer chains. The larger the number of crosslinks, the faster gelation occurs; the lower the number of crosslinks, the slower gelation occurs. Thus, for rapidly curing materials, a high number of crosslinks per molecule may be desired.

The relationship of crosslink density to speed of gelation is inversely proportional to the elongation of the material. To maximize elongation, lower crosslink density is desired, enabling longer segments of polymer chain to unravel as the polymer is stressed, which can lead to greater elongation before failure. Thus, a tradeoff may be made between printing speed and the ultimate elongation of the material. A 3D printable resin which is able to be printed with high crosslink density and, after printing, can have crosslinks selectively cleaved to enable lower crosslink density, and thus higher elongation, may be valuable.

Another problem that may be encountered is that some resins may not produce thermoplastic polymers with the desired amount of crystallinity. Crystallinity enables thermoplastic polymers to be tough, providing transient, physical crosslinks which can break and reform to dissipate energy. Crystalline materials may be difficult to 3D print via resin-based techniques. This may be because most crystalline materials have high melt transition temperatures (>100° C. often from π-stacking or hydrogen bonding) and require high temperatures to melt, or solvents to dissolve, them. Both of these aspects may be problematic, as some solvents may interfere with the 3D printing process, especially with dimensional stability and fidelity, and high heat may cause the reaction to prematurely gel because the photoinitiator in the system may act as a thermal initiator at elevated temperatures). Low melting crystals (<100° C. often long chain aliphatic hydrocarbon, ester or ether chains) are often waxy, having poor overall properties and chain slippage at low temperatures. It may be beneficial to obtain a polymer which, when printed is amorphous, however, after printing to the polymer becomes crystalline with a high melt temperature.

There remains a need for improved three-dimensional (3D) printing resin materials to overcome any of the problems noted above. The disclosed embodiments may address ore or more challenges associated with other materials systems.

SUMMARY

The present disclosure relates to sealed isocyanate photopolymerizable resin compositions. The resin compositions may be used for additive manufacturing.

One embodiment of the invention includes a photopolymerizable resin for additive manufacturing, the resin comprising: a blocked isocyanate; at least one monomer or oligomer; and a multifunctional nucleophile.

Another embodiment includes a powder composition for additive manufacturing, the powder comprising: a powdered blocked isocyanate, and a powdered dial.

Another embodiment includes a photopolymerizable resin for additive manufacturing in an oxygen environment, the resin comprising: a blocked isocyanate; a crosslinking component; at least one monomer or oligomer; and a chain transfer agent comprising at least one of a thiol, a secondary alcohol, or a tertiary amine, wherein the resin is configured to react by exposure to light to form a cured material, wherein the chain transfer agent is configured to permit at least some bonding between a layer of resin previously cured and an adjacent, subsequently cured layer of resin, despite an oxygen-rich surface present on the previously cured layer of resin at an interface between the previously cured layer of resin and the subsequently cured layer of resin.

Another embodiment includes a photopolymerizable resin for additive manufacturing printing in an oxygen environment, the resin comprising: a blocked isocyanate a photoinitiator, wherein the photoinitiator is configured to generate a free radical after exposure to light; a crosslinking component; and at least one monomer or oligomer, wherein the crosslinking component and the at least one monomer or oligomer are configured to react with the free radical to provide growth of at least one polymer chain radical within a volume of the photopolymerizable resin, wherein the at least one polymer chain radical reacts with diffused oxygen to provide an oxygen radical; and a chain transfer agent comprising at least one of a thiol, a secondary alcohol, or a tertiary amine, wherein the chain transfer agent is configured to transfer the oxygen radical to initiate growth of at least one new polymer chain radical.

Another embodiment includes a photopolymerizable resin, the resin comprising: a blocked isocyanate; a crosslinking component; at least one monomer or oligomer, wherein the crosslinking component and the at least one monomer or oligomer are configured to react to provide one or more polymer chains after exposure to light; and a chain transfer agent comprising at least one of a thiol, a secondary alcohol, or a tertiary amine, wherein the chain transfer agent is configured to transfer a free radical associated with the one of the polymer chains to another one of the polymer chains.

Another embodiment includes a storage-stable photopolymerizable resin mixture, the resin mixture comprising: at least one monomer or oligomer; and a blocked isocyanate, wherein the blocked isocyanate is configured to liberate the reactive isocyanate functionality; wherein after combination of the components, the resin mixture exhibits no more than 100% increase in the viscosity after 1 week at room temperature.

Another embodiment includes a photopolymerizable resin for additive manufacturing, the resin comprising: a blocked isocyanate; a crosslinking component; at least one monomer or oligomer; a photoinitiator, wherein the photoinitiator is configured to generate a free radical after exposure to light wherein the free radical initiates a chain reaction between the crosslinking component and the at least one monomer or oligomer to provide one or more polymer chains within a volume of the photopolymerizable resin; a chain transfer agent comprising at least one of a thiol, a secondary alcohol, or a tertiary amine, wherein the chain transfer agent is configured to reinitiate the chain reaction to provide one or more new polymer chains within a volume of the photopolymerizable resin, wherein a layer of the resin about 100 µm thick is configured to form a cured material in no more than 30 seconds; wherein the resin has a viscosity at room temperature of less than 1,000 centipoise.

Another embodiment includes a photopolymerizable resin for additive manufacturing, the resin comprising: a blocked isocyanate; less than 5% of a thiol; at least about 50% of one or more monomers; and a photoinitiator, wherein the photoinitiator is configured to form a free radical after exposure to light, such that the free radical initiates growth of one or more polymer chains including at least the difunctional and monofunctional monomers; wherein the thiol is configured to promote continued growth of the one or more polymer chains, wherein the resin is configured to react by exposure to light to form a cured material, wherein the cured material has a glass transition temperature in the range about 5-30° C.

Another embodiments includes a photopolymerizable resin for additive manufacturing, the resin comprising: a blocked isocyanate; less than about 5% of a thiol; and at least about 50% of one or more monomers; wherein the resin is configured to react to form a cured material; wherein the cured material has a toughness in the range about 3-30 MJ/m$^3$ and a strain at break ranging in the range about 30-300%.

Another embodiment includes a photopolymerizable resin for additive manufacturing, the resin comprising: a blocked isocyanate; less than about 5% of a thiol; and at least about 60% of one or more monomers, wherein the resin is configured to react by exposure to light to form a cured material; wherein the cured material has a toughness in the range about 3-100 MJ/m$^3$ and a strain at break in the range about 200-1000%.

Another embodiment includes a photopolymerizable resin for additive manufacturing, the resin comprising: a blocked isocyanate; at least at least one monomer or oligomer; and less than about 20% of a thiol, wherein the resin is configured to react by exposure to light to provide a cured material, wherein the cured material produces less than 1 part per 100 million of thiol volatiles at ambient temperature and pressure over 50 seconds in an oxygen environment.

Another embodiment includes a photopolymerizable resin for additive manufacturing, the resin comprising: a blocked isocyanate; less than about 5% of a thiol; at least about 50% of one or more acrylic monomers; and less than about 45% of one or more acrylic-functionalized oligomers, wherein the resin is configured to react by exposure to light to form a cured material; wherein the resin has a viscosity at room temperature of less than 1,000 cP; wherein the components of the resin can be combined and stored in a single pot for at least 6 months at room temperature with no more than 100% increase in the viscosity of the resin.

Another embodiment includes a photopolymerizable resin for additive manufacturing, the resin comprising: a blocked isocyanate; less than about 5% of a stabilized thiol; at least 50% of one or more acrylic monomers; and less than about 45% of one or more acrylic-functionalized oligomers, wherein the resin is configured to react by exposure to light to form a cured material; wherein the components of the resin can be combined and stored in a single pot for at least 6 months at room temperature with no more than with no more than 100% increase in the viscosity of the resin.

Another embodiment includes a photopolymerizable resin for additive manufacturing comprising: a blocked isocyanates; less than about 5% of a stabilized thiol; and at least about 50% of one or more monomers; wherein the resin is configured to react by exposure to light to form a cured material, wherein a layer of the resin about 100 µm thick is configured to form a cured material in no more than 30 seconds; wherein the cured material has a toughness in the range about 3-100 MJ/m$^3$ and a strain at break in the range about 30-1000%.

Another embodiment includes an article manufactured from or comprising any of the photopolymerizable resins disclosed herein.

DETAILED DESCRIPTION

Resins of the disclosure comprise "sealed" or blocked isocyanates, which in some embodiments, may provide desirable properties related to crosslink density and/or crystallinity of cured resins. In some cases, the resin mixture may have one or more desirable properties related to shelf-stability, viscosity, print and curing speed, or odor. Such resins may be used in the manufacture of articles made by additive manufacturing (e.g., 3D printing). Some of the properties of the cured resins may include high elongation, flexibility, and toughness, which in turn can be suitable for a number of manufactured articles. For example, a nonlimiting list of manufactured articles include a footwear midsole, a shape memory foam, an implantable medical device, a wearable article, an automotive seat, a seal, a gasket, a damper, a hose, and/or a fitting. The resin may comprise a number of components, as described herein.

For example, one embodiment of the invention includes a photopolymerizable resin for additive manufacturing, the resin comprising: a blocked isocyanate; and a multifunctional nucleophile. Another embodiment includes a photopolymerizable resin for additive manufacturing, the resin comprising: a blocked isocyanate; at least one monomer or oligomer; and a multifunctional nucleophile.

Blocked isocyanates (or "sealed isocyanates") are molecules that comprise isocyanate functionalities which exist in a nonreactive chemical state but which may be unblocked (or "unsealed") by the application of an external stimulus (e.g., heat or light), such that the nonreactive isocyanate species can be reformed into reactive isocyanate species. Isocyanates can be blocked, for example, by cyclization (i.e. reaction of the isocyanate with itself to form a dimer or trimer), by reaction with a urea to form a biuret, by reaction with a urethane to form an allophanate, or by reaction with a blocking agent to endcap the isocyanate functionalities. The blocked isocyanate may include monofunctional blocked isocyanates or polyfunctional blocked isocyanates such as monomers, dimers, trimers, etc.

Blocked isocyanates may include multifunctional -mer configurations of isocyanates, such as uretdione (dimerized isocyanates), biuret, allophanates, or isocyanaurates (trimerized isocyanates). Isocyanates can react with themselves to form dimers (uretdione) or trimers (isocyanaurates). For example, the blocked isocyanate may include a uretdione of hexamethylene diisocyanate (HDI-dimer), a uretdione of isophorone diisocyanate (IDI-dimer), a uretdione of methylene dicyclohexyl diisocyanate (MDI-dimer), a uretdione of hydrogenated methylene dicyclohexyl diisocyanate (HMDI-dimer), and/or a uretdione of toluene diisocyanate (TDI-dimer). Further, the blocked isocyanate may include an isocyanaurate of hexamethylene diisocyanate (HDI-trimer), an isocyanaurate of isophorone diisocyanate (IDI-trimer), an isocyanaurate of methylene dicyclohexyl diisocyanate (MDI-trimer), an isocyanaurate of hydrogenated methylene dicyclohexyl diisocyanate (HMDI-trimer), and/or an isocyanaurate of toluene diisocyanate (TDI-trimer). Upon application of an external stimulus (e.g., heat or light), the blocked (nonreactive) isocyanate species can be reformed into a reactive isocyanate species through thermal reorganization.

Isocyanates can react with urea to form biuret. For example, the blocked isocyanate may include a biuret of hexamethylene diisocyanate (HDI-biuret), a biuret of isophorone diisocyanate (IDI-biuret), a biuret of methylene dicyclohexyl diisocyanate (MDI-biuret), a biuret of hydrogenated methylene dicyclohexyl diisocyanate (HMDI-biuret), and/or a biuret of toluene diisocyanate (TDI-biuret). The blocked isocyanate may comprise a mixture of isocyanates in a variety of chemical configurations and blocking agents. For example, the production of HDI-dimer may also produce a small amount of biuret (HDI-biuret) which is present in the uretdione mixture. Upon application of an external stimulus (e.g., heat or light), the blocked (nonreactive) isocyanate species can be reformed into a reactive isocyanate species through the liberation of the urea group.

Isocyanates can react with urethane to form allophanate. For example, the blocked isocyanate may include an allophanate of hexamethylene diisocyanate (HDI-allophanate), an allophanate of isophorone diisocyanate (IDI-allophanate), an allophanate of methylene dicyclohexyl diisocyanate (MDI-allophanate), an allophanate of hydrogenated methylene dicyclohexyl diisocyanate (HMDI-allophanate), and/or an allophanate of toluene diisocyanate (TDI-allophanate). Upon application of an external stimulus (e.g., heat or light), the blocked (nonreactive) isocyanate species can be reformed into a reactive isocyanate species through the liberation of the urethane group.

In some cases, the blocked isocyanate may include an isocyanate and a blocking agent. Blocked isocyanates may be formed by the reaction of an isocyanate and a blocking agent. In some cases, the isocyanate may be configured to react with the blocking agent, such that isocyanate functional groups of the isocyanate are end capped. For example, isocyanates may include, but are not limited to: hexamethylene diisocyanate (HDI), isophorone diisocyanate (IDI), methylene dicyclohexyl diisocyanate (MDI), hydrogenated methylene dicyclohexyl diisocyanate (HMDI), and toluene diisocyanate (TDI). Some examples of blocking agents may include nucleophiles, derivatives of alcohols, hindered amines, caprolactams, phenols, oximes, and/or pyrazoles malonates. Upon application of an external stimulus (e.g., heat or light), the blocked (nonreactive) isocyanate species can be reformed into a reactive isocyanate species through the liberation of the blocking group. Once in its reactive R—NCO form, the unblocked isocyanate may react with nucleophiles.

The multifunctional nucleophile may be any compound that includes one or more chemical moieties and nucleophilic group. The multifunctional nucleophile may react with components of the resin mixture to form a polymer. During storage, the blocked isocyanate may not interact with the multifunctional nucleophile. In some cases, the multifunctional nucleophile includes at least one of a multifunctional alcohol, a multifunctional thiol, and/or a multifunctional amine. In specific cases, the multifunctional nucleophile includes a secondary thiol. In some cases, the secondary thiol includes at least one of Pentaerythritol tetrakis (3-mercaptobutylate); 1,4-bis (3-mercaptobutyloxy) butane; and/or 1,3,5-Tris(3-melcaptobutyloxethyl)-1,3,5-triazine. In other cases, the multifunctional alcohol is a polyol.

The resin may react by exposure to light to form a cured material. The blocked isocyanate may be configured to form crosslinks within the cured material. Heat treatment may be applied to the cured material to unblock/liberate blocked isocyanates such that the crosslinks they had formed are cleaved. Thus, heat treatment may decrease the crosslink density of the cured material. The temperature and duration of heat treatment may be tuned to adjust the amount of blocked isocyanate crosslinks cleaved. Heat treatment may decrease crosslink density of the cured material by between about 10-100%. Further, the liberated isocyanates can form urethane polymers, that may agglomerate for form crystallites. Heat treatment may increase crystallinity of the cured material by between about 10-100%. In some embodiments, the resin may comprise a blocked isocyanate dimer functionalized with acrylate moieties, wherein the resin has a viscosity at room temperature of less than 1,000 cP. The resin may react by exposure to light to form a cured material, wherein the isocyanate dimer may form crosslinks within the cured material. Thermal treatment of the cured material may liberate the blocked isocyanate dimer, thereby cleaving crosslinks and/or forming crystalline or semi-crystalline species.

Another embodiment of the invention includes a photopolymerizable resin for additive manufacturing (e.g., 3D printing), the resin comprising: a blocked isocyanate; and at least one monomer and/or oligomer, wherein the resin (i.e., resin components) is configured to react by exposure to light to form a cured material.

In some cases, the resin includes at least one monomer and/or oligomer. In some embodiments, the at least one monomer and/or oligomer is 1-95% by weight of the resin. In other cases, the at least one monomer and/or oligomer is >1%, 1.0-4.99%, 5-10% or about 20%, 30%, 40%, 50%, 60%, 70%, 80%, or 90% by weight of the resin. The monomer may include small molecules that combine with each other to form an oligomer or polymer. The monomer may include bifunctional monomers having two functional groups per molecule and/or polyfunctional monomers having more than one functional group per molecule. The oligomer may include molecules consisting of a few monomer units. For example, in some cases, the oligomer may be composed of two, three, or four monomers (i.e., dimer, trimer, or tetramer). The oligomer may include bifunctional oligomers having two functional groups per molecule and/or polyfunctional oligomers having more than one functional group per molecule.

The at least one monomer and/or oligomer may be capable of reacting with the other resin components to form a connected polymer network. For example, the at least one monomer and/or oligomer may include one or more functional groups capable of reacting with the two or more reactive groups of the crosslinking component. The at least one monomer and/or oligomer may include an acrylic functional group. For example, a methacylate, acrylate or acrylamide functional group.

In some cases, at least one monomer and/or oligomer includes one or more monomers. For example, the one or more monomers may be about 1-95% by weight of the resin. Or, the resin may comprise at least about 50% or at least about 60% of one or more monomers. In other cases, at least one monomer and/or oligomer includes an acrylic monomer. The acrylic monomer may have a molecular weight less than 200 Da, less than 500 Da, or less than 1,000 Da. The acrylic monomer may include at least one of 2-ethylhexyl acrylate, hydroxypropyl acrylate, cyclic trimethylolpropane formal acrylate, isobornyl acrylate, butyl acrylate, and/or N,N-Dimethylacrylamide. In some cases, the photopolymerizable resin may comprise at least one monomer and/or oligomer, wherein each monomer and/or oligomer may be an acrylic monomer, a thiol monomer and/or an -ene monomer.

The photopolymerizable resin may demonstrate improved shelf-stability. Resin compositions containing thiols and non-thiol reactive species such as -enes and acrylates may undergo a dark reaction (i.e, an ambient thermal free-radical polymerization or Michael Addition), which reduces the shelf-life of these compositions. To account for lower shelf-life of these resins, they may either be stored under cold conditions or as a two-pot system. By contrast, thiol-acrylate resins such as those of the disclosed materials may include a stabilized thiol (e.g., a secondary thiol). The stabilized thiol may have decreased reactivity, which can potentially increase the shelf-life of 3D printable resin compositions and enable storage as a single-pot resin system at room temperature. Moreover, the resin remaining at completion of a 3D printing run may be reused in a subsequent run.

Stabilized thiols may include any thiol that exhibits fewer ambient thermal reactions (e.g., nucleophilic substitution with monomers or oligomers) compared to other thiols. In some cases, the stabilized thiol includes a bulky side chain. Such bulky side chains may include at least one chemical group, such as a C1-C18 cyclic, branched, or straight alkyl, aryl, or heteroaryl group. In some cases, the stabilized thiol includes a secondary thiol. In other cases, the stabilized thiol includes a multi-functional thiol. In some cases, the stabilized thiol includes at least one of a difunctional, trifunctional, and/or tetrafunctiorial thiol. In some embodiments, the stabilized thiol includes at least one of a Pentaerythritol tetrakis (3-mercaptobutylate); and/or 1,4-bis (3-mercaptobutylyloxy) butane.

Another embodiment of the invention includes a storage-stable photopolymerizable resin mixture, the resin mixture comprising: at least one monomer and/or oligomer; and a blocked isocyanate, wherein the blocked isocyanate is configured to liberate the reactive isocyanate functionality during or after exposure of the resin to light, wherein the components of the resin mixture can be combined and stored (for example, in a single pot) for at least 6 months at room temperature with no more than 2%, 5%, 10%, 25%, 50% or 100% increase in the viscosity of the resin.

Another embodiment of the invention includes a storage-stable photopolymerizable resin mixture, the resin mixture, comprising: at least one monomer and/or oligomer; and a blocked isocyanate, wherein the blocked isocyanate is configured to liberate the reactive isocyanate functionality during exposure of the resin to light, wherein the components of the resin mixture can be combined and stored in a single pot for at least 1 week at room temperature with no more than 2%, 5%, 10%, 25%, 50% or 100% increase in the viscosity of the resin.

In other embodiments, the disclosure provides a storage-stable photopolymerizable resin mixture, the resin mixture comprising: at least one monomer and/or oligomer; and a blocked isocyanate, wherein the blocked isocyanate is configured to liberate the reactive isocyanate functionality after exposure of the photopolymerizable resin to light wherein the components of the resin mixture can be combined and stored in a single pot for at least 1 week at room temperature with no more than 2%, 6%, 10%, 25%, 50% or 100% increase in the viscosity of the resin.

The stability of the resin mixture may be tuned by inclusion of a stabilized thiol. In some cases, the photopolymerizable resin is configured for continuous use in a 3D printing operation in an air environment for a period of 1 month without an increase in viscosity of more than 2%, 5%, 10%, 25%, 50% or 100%. In some cases, the photopolymerizable is configured for continuous use in a 3D printing operation in an air environment for a period of 3 months without an increase in viscosity of more than 10%. In some cases, the photopolymerizable resin is configured for continuous use in a 3D printing operation in an air environment for a period of 6 months without an increase in viscosity of more than 10%. In some cases, the photopolymerizable resin a is configured for continuous use in a 3D printing operation in an air environment for a period of 1 year without an increase in viscosity of more than 10%. In some cases, the photopolymerizable resin is configured for continuous use in a 3D printing operation in an air environment for a period of 2 years without an increase in viscosity of more than 10%.

The cured materials in the present disclosure may provide mechanical properties that are tough and flexible (measured, e.g., by percent strain at break or strain capacity) that may be suitable for use in manufactured articles in which these properties are desired (e.g., shoe midsoles, insoles, outsoles). Articles comprising these cured materials may thus be produced at reduced expense with more possible efficiency and customizability of article designs and mechanical properties in an additive manufacturing process.

Specifically, toughness may be customized by controlling the percentage and type of monomers with optional combination of additional oligomers, fillers, and additives. Control of these parameters may allow specific design of the materials elongation capacity (strain) and the force at which this elongation occurs (stress). Taken together, the stress/strain behavior of a material may impact its fracture toughness.

Additionally, the strain at break may be customized by controlling the percentage and type of monomers with optional combination of additional oligomers, fillers, and additives. Control of the underlying network morphology, the density between crosslinks, and the tear strength of the material (enabled by filler and matrix-filler interactions) may allow control over the elongation (strain) of the material. In some cases, the cured material has a strain at break of about 100%. In some cases, the cured material has a strain at break of about 200%. In some cases, the cured material has a strain at break of about 300%. In some cases, the cured material has a strain at break of about 400%. In some cases, the cured material has a strain at break of about 500%. In some cases, the cured material has a strain at break of about 600%. In some cases, the cured material has a strain at break of about 700%. In some cases, the cured material has a strain at break of about 800%.

Some embodiments of the disclosure include a photopolymerizable resin for additive manufacturing, the resin comprising: a blocked isocyanate, and at least one monomer and/or oligomer, wherein the resin is configured to react by exposure to light to form a cured material; wherein the cured material has a strain capacity of about 10%. In some cases, the cured material has a strain capacity of about 30%, about 50%, about 100%, about 200%, about 300%, or about 500%.

The resin mixture may be liquid, solid, or semi-solid. In some cases, the solid resin mixture may be in powder form. Powders may be processed via Selective Laser Sintering (SLS). Some embodiments of the invention provide, a powder composition for additive manufacturing, the powder comprising: a powdered blocked isocyanate, and a powdered polyol. Other embodiments provide a powder composition for additive manufacturing, the powder comprising: a powdered blocked isocyanate, and a powdered diol.

The molecular weight of the powdered polyol may be in the range about 500-20,000 Daltons. The powdered polyol may include a powdered did, for example semi-crystalline powdered diols. The powdered polyol may include hydroxy functionalized polymers and/or oligomers. In some cases, the powdered polyol may include oligomer and/or polymer diols of polycaprolactones, polylactides, polyethylene glycols, polyurethanes, etc.

In some cases, the powdered blocked isocyanate may include a multifunctional aromatic blocked isocyanate. In some cases, the powdered blocked isocyanate includes coronates. The powder composition may further comprise a powdered polymer. In some cases, the powdered polymer includes nylons, urethanes, polyesters, polyethylenes, polypropylenes, poly lactic acid, and/or polycaprolactones.

Some embodiments of the invention may include a photopolymerizable resin for additive manufacturing, the resin comprising: about 1-20% of a thiol; about 30-90% of an acrylic monomer; about 1-70% of a blocked isocyanate; wherein the resin is configured to react by exposure to light to form a cured material.

In some cases, the thiol includes a secondary thiol. In specific cases, the secondary thiol includes at least one of Pentaerythritol tetrakis (3-mercaptobutylate); 1,4-bis (3-mercaptobutylyloxy) butane; and/or 1,3,5-Tris(3-melcaptobutyloxethyl)-1,3,5-triazine. In some cases, the acrylic monomer includes at least one of 2-ethylhexyl acrylate, hydroxypropyl acrylate, cyclic trimethylolpropane formal acrylate, isobornyl acrylate, butyl acrylate, and/or N,N-Dimethylacrylamide. In some cases, the blocked isocyanate includes an isocyanate and a blocking agent. In specific cases, the isocyanate includes, HDI, IDI, MDI, HDMI and/or TDI. In some cases, the blocked isocyanate includes uretdione, biuret, allophphanates, and/or isocyanaurates. In some cases, blocking agent includes dimer isocyanates and/or trimer isocyanates. In specific cases, the blocking agent includes derivatives of alcohols, hindered amines, caprolactams, phenols, oximes, and/or pyrazoles malonates.

The resin viscosity may be any value that facilitates use in additive manufacturing (e.g., 3D printing) of an article. Higher viscosity resins are more resistant to flow, whereas lower viscosity resins are less resistant to flow. Resin viscosity may affect, for example, printability, print speed or print quality. For example, the 3D printer may be compatible only with resins having a certain viscosity. Or, increasing resin viscosity may increase the time required to smooth the surface of the deposited resin between print layers because the resin may not settle out as quickly.

The thiol-acrylate photopolymerizable resin of the disclosed materials may also possess a high cure rate and low viscosity. Additive manufactured objects are created by building up materials layer-by-layer. Each layer is built by depositing liquid resin and applying light to photocure. The viscosity and cure rate of the resin, therefore, affect print speed. A low viscosity resin will quickly spread (e.g., 1-30 seconds) into a flat layer, without the need to apply heat or mechanically manipulate the layer. The spread can be faster (e.g., 1-10 seconds) with mechanical manipulation. Additionally, lower viscosity may allow faster movement of the recoating blade. The faster the cure rate, the more quickly a next, subsequent layer can be built.

The resin viscosity may be tuned, for example, by adjusting the ratio of monomers to oligomers. For example, a resin having higher monomer content may exhibit a lower viscosity. This may be because the lower molecular weight monomers are able to solvate the oligomers, decreasing oligomer-oligomer interactions and thus decreasing the overall resin viscosity. The resin may have a viscosity at or above room temperature of less than about 250 centipoise, less than about 500 centipoise, less than about 750 centipoise, or less than about 1,000 centipoise. In some cases, the resin has a viscosity at a temperature between 0° C. and 80° C. of less than about 1000 centipoise, less than about 500 centipoise, or less than about 100 centipoise. In some cases, the resin has a viscosity at or above room temperature of less than about 1000 centipoise, less than about 500 centipoise, or less than about 100 centipoise.

Another aspect of the invention provides a 3D printable resin which is able to be printed with high crosslink density and, after printing, can have crosslinks selectively cleaved to enable lower crosslink density, and thus higher elongation. This may be accomplished by post-treating cured materials comprising the blocked isocyanate, such that isocyanate may be liberated, thus cleaving crosslinks in the cured material. In some cases, the cured material is post-treated with heat. In specific cases, the cured material is post-treated with heat, such that crosslink density of the polymer network is decreased by an amount proportional to or less than the % composition of the resin equal to the total amount of blocked isocyanate crosslinking molecules within the resin mixture. In some cases, the cured material has a strain capacity of about 10%, 30%, 50%, 100%, 200%, 300%, or 500%.

Another aspect of the invention provides a resin which may become crystalline or semi-crystalline with a high melt temperature after printing. Such crystallinity may enable thermoplastic polymers to be tough, providing transient, physical crosslinks that can break and reform to dissipate energy as may be desired. In some cases, the cured material is post-treated with heat, such that crystallinity of the polymer network is increased by an amount proportional to or less than the % composition of the resin equal to the total amount of blocked isocyanate molecules within the resin mixture. In some cases, the cured material has a crystal fraction of about 1, about 10% or about 25%.

Another embodiment of the invention includes a photopolymerizable resin for additive manufacturing, the resin comprising: a blocked isocyanate, and a polyol, wherein the resin includes the blocked isocyanate and the polyol in about a stoichiometric ratio.

In some cases, the polyol has a molecular weight greater than about 100 Daltons, about 500 Daltons, about 1000 Daltons, about 2000 Daltons, or about 5000 Daltons.

A photopolymerizable resin for additive manufacturing, the resin comprising: a blocked isocyanate, and a thiol, wherein the resin includes the blocked isocyanate and the polyol in about a stoichiometric ratio. In some cases, the isocyanate is configured to react with the blocking agent, such that functional groups of the isocyanate are end capped. In some cases, the thiol includes a difunctional thiol or a multifunctional thiol. In some cases, the thiol includes a secondary thiol. In some cases, the thiol has a molecular weight greater than about 100 Daltons, about 500 Daltons, about 1000 Daltons, about 2000 Daltons, or about 5000 Daltons.

Another embodiment of the invention provides a photopolymerizable resin for additive manufacturing in an oxygen environment, the resin comprising: a blocked isocyanate; a crosslinking component; at least one monomer and/or oligomer; and a chain transfer agent comprising at least one of a thiol, a secondary alcohol, and/or a tertiary amine, wherein the resin is configured to react by exposure to light to form a cured material, wherein the chain transfer agent is configured to permit at least some bonding between a layer of resin previously cured and an adjacent, subsequently cured layer of resin, despite an oxygen-rich surface present on the previously cured layer of resin at an interface between the previously cured layer of resin and the subsequently cured layer of resin. In some cases, bonding is covalent, crosslinking, or physical entanglement of polymer chains.

The crosslinking component may include any compound that reacts by forming chemical or physical links (e.g., ionic, covalent, or physical entanglement) between the resin components to form a connected polymer network. The crosslinking component may include two or more reactive groups capable of linking to other resin components. For example, the two or more reactive groups of the crosslinking component may be capable of chemically linking to other resin components. The crosslinking component may include terminal reactive groups and/or side chain reactive groups. The number and position of reactive groups may affect, for example, the crosslink density and structure of the polymer network.

The two or more reactive groups may include an acrylic functional group. For example, a methacylate, acrylate or acrylamide functional group. In some cases, the crosslinking component includes a difunctional acrylic oligomer. For example, the crosslinking component may include an aromatic urethane acrylate oligomer or an aliphatic urethane acrylate oligomer. The crosslinking component may include at least one of CN9167, CN9782, CN9004, poly(ethylene glycol) diacrylate, bisacrylamide, tricyclo[$5.2.1.0^{2,6}$]decanedimethanol diacrylate, and/or trimethylolpropane triacrylate. The size of the crosslinking component may affect, for example, the length of crosslinks of the polymer network.

The number of crosslinks or crosslink density may be selected to control the properties of the resulting polymer network. For example, polymer networks with fewer crosslinks may exhibit higher elongation, whereas polymer networks with greater crosslinks may exhibit higher rigidity. This may be because the polymer chains between the crosslinks may stretch under elongation. Low crosslink-density chains may coil up on themselves to pack more tightly and to satisfy entropic forces. When stretched, these chains can uncoil and elongate before pulling on crosslinks, which may break before they can elongate. In highly crosslinked materials, the high number of crosslinked chairs may lead to little or no uncoilable chain length and nearly immediate bond breakage upon strain.

The amount of the crosslinking component may be selected to control the crosslink density and resulting properties of the polymer network. In some cases, the crosslinking component is 1-95% by weight of the resin. In other cases, the crosslinking component is >1%, 1.0-4.99%, 5-10% or about 20%, 30%, 40%, 50%, 60%, 70%, 80%, or 90% by weight of the resin.

In some cases, the resin includes at least one monomer and/or oligomer. In some embodiments, the at least one monomer and/or oligomer is 1-95% by weight of the resin. In other cases, the at least one monomer and/or oligomer is >1%, 1.0-4.99%, 5-10% or about 20%, 30%, 40%, 50%, 60%, 70%, 80%, or 90% by weight of the resin. The monomer may include small molecules that combine with each other to form an oligomer or polymer. The monomer may include bifunctional monomers having two functional groups per molecule and/or polyfunctional monomers having more than one functional group per molecule. The oligomer may include molecules consisting of a few monomer units. For example, in some cases, the oligomer may be composed of two, three, or four monomers (i.e., dimer, trimer, or tetramer). The oligomer may include bifunctional oligomers having two functional groups per molecule and/or polyfunctional oligomers having more than one functional group per molecule.

The at least one monomer and/or oligomer may be capable of reacting with the other resin components to form a connected polymer network. For example, the at least one monomer and/or oligomer may include one or more functional groups capable of reacting with the two or more reactive groups of the crosslinking component. The at least one monomer and/or oligomer may include an acrylic functional group. For example, a methacylate, acrylate or acrylamide functional group.

In some cases, at least one monomer and/or oligomer includes one or more monomers. For example, the one or more monomers may be about 1-95% by weight of the resin. Or, the resin may comprise at least about 50% or at least about 60% of one or more monomers. In other cases, at least one monomer and/or oligomer includes an acrylic monomer. The acrylic monomer may have a molecular weight less than 200 Da, less than 500 Da, or less than 1,000 Da. The acrylic monomer may include at least one of 2-ethylhexyl acrylate, hydroxypropyl acrylate, cyclic trimethylolpropane formal acrylate, isobornyl acrylate, butyl acrylate, and/or N,N-Dimethylacrylamide.

Chain transfer agents may include any compound that possesses at least one weak chemical bond that potentially reacts with a free-radical site of a growing polymer chain and interrupts chain growth. In the process of free radical chain transfer, a radical may be temporarily transferred to the chain transfer agent which reinitiates growth by transferring the radical to another component of the resin, such as the growing polymer chain or a monomer. The chain transfer agent may affect kinetics and structure of the polymer network. For example, the chain transfer agent may delay formation of the network. This delayed network formation may reduce stress in the polymer network leading to favorable mechanical properties.

The chain transfer agent may comprise at least one of a thiol, a secondary alcohol, and/or a tertiary amine. The secondary alcohol may include at least one of isopropyl alcohol, and/or hydroxypropyl acrylate. In some cases, the thiol is about 0.5% to 4.0%, 4.0% to 4.7%, 4.7% to 4.99%, 4.99-5%, or 5-50% by weight of the resin. The thiol may include a secondary thiol. The secondary thiol may include at least one of Pentaerythritol tetrakis (3-mercaptobutylate); 1,4-bis (3-mercaptobutylyloxy) butane; and/or 1,3,5-Tris(3-melcaptobutyloxethyl)-1,3,5-triazine. The tertiary amine may include at least one of aliphatic amines, aromatic amines, and/or reactive amines. The tertiary amine may include at least one of triethyl amine, N,N'-Dimethylaniline, and/or N,N'-Dimethylacrylamide.

In some cases, the chain transfer agent may be configured to react with an oxygen radical to initiate growth of at least one new polymer chain and/or reinitiate growth of a polymer chain terminated by oxygen. For example, the chain transfer agent may include a weak chemical bond such that the radical may be displaced from the oxygen radical and transferred to another polymer, oligomer or monomer.

Additive manufacturing processes, such as 3D printing, may produce three dimensional objects by sequentially curing layers of a photopolymerizable resin. Thus, articles produced by additive manufacturing may comprise a majority or plurality of photocured layers. Additive manufacturing may be performed in an oxygen environment, wherein oxygen may diffuse into a deposited layer of resin.

In some cases, an oxygen radical may be formed by a reaction of diffused oxygen with a growing polymer chain. For example, at the oxygen-rich surface of a layer of resin, oxygen may react with initiator radicals or polymer radicals to form an oxygen radical. The oxygen radical may be affixed to a polymer side chain. Oxygen radicals, for example, peroxy radicals, may slow down curing of the resin. This slowed curing may lead, for example, to the formation of a thin, sticky layer of uncured monomers and/or oligomers at the oxygen-rich surface of a previously cured layer of resin, which would otherwise minimize adhesion to an adjacent subsequently cured layer of resin. the oxygen radical is affixed to a polymer side chain.

In some cases, chain transfer agent is configured to react with an oxygen radical to initiate growth of at least one new polymer chain. In further cases, the oxygen radical may be a peroxy radical. In further cases, the oxygen radical is formed by a reaction of diffused oxygen with a growing polymer chain. In some cases, chain transfer agent is configured to reinitiate growth of a polymer chain terminated by oxygen. In some cases, the chain transfer agent is configured to transfer a radical from a first polymer chain or chain branch within a previously cured resin layer to a second polymer chain or chain branch within the volume of the photopolymerizable resin. In some cases, the chain transfer agent is configured to promote growth of at least one new polymer chain near the oxygen-rich surface present on the previously cured layer of resin.

Due at least in part to the presence of a chain transfer agent, at least some bonding between a layer of resin previously cured and an adjacent, subsequently cured layer of resin, may occur despite an oxygen-rich surface present on the previously cured layer of resin at an interface between the previously cured layer of resin and the subsequently cured layer of resin. In some cases, the bonding may be covalent. In some embodiments, the bonding may be ionic. In some cases, the bonding may be physical entanglement of polymer chains. Additionally, in some cases, the chain transfer agent is ½-50% by weight of resin. In some cases, the chain transfer agent is about 0.5-4.0%, 4.0-4.7%, 4.7-4.99%, 4.99-5%, or 5-50% by weight of the resin.

The resin materials may exhibit excellent interlayer strength when 3D printed in air environments. Because three-dimensional prints are built layer by layer, when printing in open-air, each resin layer will have an opportunity (e.g., during patterning) to become enriched with oxygen at its surface exposed to air. With prior resins, this oxygen enrichment resulted in weak adhesion between layers because the oxygen available at the oxygen-rich interfaces between layers inhibited free-radical polymerization, thereby limiting chain growth and retarding the reaction. The photopolymerizable resins of the present invention, however, may include a secondary thiol that can overcome this problem and promote the chemical and physical crosslinking between 3D printed layers even in the presence of elevated or ambient oxygen levels at the interfaces between layers.

Further, the resin materials may demonstrate lower sensitivity to oxygen. In free-radical polymerization systems, oxygen reacts with primary initiating or propagating radicals to form peroxy radicals. In prior resins, these peroxy radicals would tend to terminate polymerization. In the thiol-acrylate photopolymerizable resins, however, thiols may act as a chain transfer agent allowing for further propagation of the polymerization reaction. Lower sensitivity to oxygen may enable open-air manufacturing processes without the expense of reduced-oxygen manufacturing (e.g., a nitrogen or argon blanket).

Any suitable additive compounds may be optionally added to the resin. For example, the resin may further comprise poly(ethylene glycol). The resin may further comprise polybutadiene. The resin may further comprise polydimethylsiloxane acrylate copolymer. The resin may further comprise poly(styrene-co-maleic anhydride).

The resin may further comprise a photoinitiator, an inhibitor, a dye, and/or a filler. The photoinitiator may be any compound that undergoes a photoreaction on absorption of light, producing a reactive free radical. Therefore, photoinitiators may be capable of initiating or catalyzing chemical reactions, such as free radical polymerization. The photoinitiator may include at least one of Phenylbis(2,4,6-trimethylbenzoyl)phosphine oxide, Diphenyl(2,4,6-trimethylbenzoyl)phosphine oxide, Bis-acylphosphine oxide, Diphenyl (2,4,6-trimethylbenzoyl)phosphine oxide, and/or 2,2'-Dimethoxy-2-phenylacetophenone. In some cases, the photoinitiator is 0.01-3% by weight of the resin.

The inhibitor may be any compound that reacts with free radicals to give products that may not be able to induce further polymerization. The inhibitor may include at least one of Hydroquinone, 2-methoxyhydroquinone, Butylated hydroxytoluene, Diallyl Thiourea, and/or Diallyl Bisphenol A.

The dye may be any compound that changes the color or appearance of a resulting polymer. The dye may also serve to attenuate stray light within the printing region, reducing unwanted radical generation and overcure of the sample. The dye may include at least one of 2,5-Bis(5-tert-butyl-benzoxazol-2-yl)thiophene, Carbon Black, and/or Disperse Red 1.

The filler may be any compound added to a polymer formulation that may occupy the space of and/or replace other resin components. The filler may include at least one of titanium dioxide, silica, calcium carbonate, clay, aluminosilicates, crystalline molecules, crystalline oligomers, semi-crystalline oligomers, and/or polymers, wherein said polymers are between about 1,000 Da and about 20,000 Da molecular weight.

An article may be made from the resin as described in any embodiment. The article may be made by cast polymerization or additive manufacturing processes, such as 3D printing. The article may include footwear midsole, a shape memory foam, an implantable medical device, a wearable article, an automotive seat, a seal, a gasket, a damper, a hose, and/or a fitting. An article may be made having a majority of layers comprising the resin as described in any embodiment.

In some embodiments, an article may be made from the resin as described in any embodiment that further includes a surface coating. The surface coating may be applied to an article for potentially obtaining desired appearance or physical properties of said article. The surface coating may comprise a thiol. The surface coating may comprise a secondary thiol. The surface coating may comprise an alkane. The surface coating may comprise a siloxane polymer. The surface coating may comprise at least one of semi-fluorinated poly ether and/or per-fluorinated poly ether.

The glass transition temperature ($T_g$) of the cured material is the temperature at which a polymer goes from an amorphous rigid state to a more flexible state. The glass transition temperature of the cured material may be customized by controlling the percentage and type of monomer, the percentage and type of oligomer, filler, plasticizer and curing additives (e.g., dye, initiator, or inhibitor). In some cases, the cured material has a glass transition temperature in the range about 10° C. to about −30° C. In some cases, the cured material has a glass transition temperature with a full width half max of more than 50° C. In some cases, the resin has a glass transition temperature with a full width half max of less than 50° C. In some cases, the resin has a glass transition temperature less than about 0° C. or greater than about 80° C.

In some cases, the article has a tensile strength in the Z-direction within about 33% of the tensile strength in the X-direction. In other cases, the article has a tensile strength in the Z-direction within about 10% of the tensile strength in the X-direction. In other cases, the article has a tensile strength in the Z-direction within about 5% of the tensile strength in the X-direction. In other cases, the article has a compressive strength in the Z-direction within about 33% of the compressive strength in the X-direction. In other cases, the article has a compressive strength in the Z-direction within about 10% of the compressive strength in the X-direction. In other cases, the article has a compressive strength in the Z-direction within about 5% of the compressive strength in the X-direction.

Another embodiments of the invention provides a photopolymerizable resin for additive manufacturing printing in an oxygen environment, the resin comprising: a blocked isocyanate; a photoinitiator, wherein the photoinitiator is configured to generate a free radical after exposure to light; a crosslinking component; and at least one monomer and/or oligomer, wherein the crosslinking component and the at least one monomer and/or oligomer are configured to react with the free radical to provide growth of at least one polymer chain radical within a volume of the photopolymerizable resin, wherein the at least one polymer chain radical reacts with diffused oxygen to provide an oxygen radical; and a chain transfer agent comprising at least one of a thiol, a secondary alcohol, and/or a tertiary amine, wherein the chain, transfer agent is configured to transfer the oxygen radical to initiate growth of at least one new polymer chain radical.

In some embodiments, the photoinitiator may be configured to generate a free radical after exposure to light. In some embodiments, the crosslinking component and the at least one monomer and/or oligomer are configured to react with the free radical to provide growth of at least one polymer chain radical within a volume of the photopolymerizable resin. In some embodiments, the at least one polymer chain radical reacts with diffused oxygen to provide an oxygen radical. In some embodiments, the chain transfer agent may be configured to transfer the oxygen radical to initiate growth of at least one new polymer chain radical.

In some embodiments, the crosslinking component and the at least one monomer and/or oligomer are configured to react to provide one or more polymer chains after exposure to light. In some embodiments, the chain transfer agent may be configured to transfer a free radical associated with the one of the polymer chains to another one of the polymer chains.

In some embodiments, the photoinitiator may be configured to generate a free radical after exposure to light wherein the free radical initiates a chain reaction between the crosslinking component and the at least one monomer and/or oligomer to provide one or more polymer chains within a volume of the photopolymerizable resin. In some embodiments, the chain transfer agent may be configured to reinitiate the chain reaction to provide one or more new polymer chains within a volume of the photopolymerizable resin.

Another embodiment of the invention includes a photopolymerizable resin, the resin comprising: a blocked isocyanate; a crosslinking component; at least one monomer and/or oligomer, wherein the crosslinking component and the at least one monomer and/or oligomer are configured to react to provide one or more polymer chains after exposure to light; and a chain transfer agent comprising at least one of a thiol, a secondary alcohol, and/or a tertiary amine, wherein the chain transfer agent is configured to transfer a free radical associated with the one of the polymer chains to another one of the polymer chains.

Another embodiment of the invention includes a storage-stable photopolymerizable resin mixture, the resin mixture comprising: a blocked isocyanate; at least one monomer and/or oligomer, wherein the at least one monomer and/or oligomer includes one or more acrylic monomers, wherein the one or more acrylic monomers are at least about 50% by weight of the resin; and less than about 5% of a stabilized thiol comprising one or more thiol functional groups, wherein the stabilized thiol is configured to inhibit a nucleophilic substitution reaction between the one or more thiol functional groups and the one or more monomers or oligomers, wherein the components of the resin mixture can be combined and stored in a single pot for at least 6 months at room temperature with no more than 2%, 5%, 10%, 25%, 50% or 100% increase in the viscosity of the resin.

Unblocked isocyanates, in the presence of a nucleophile, may react in a matter of seconds to days (depending on the strength of the nucleophile). If the isocyanate is blocked, it may exist in the presence of a nucleophile indefinitely. Because the blocking groups are thermally labile and because temperature is an average of the kinetic energy in the system, at some time point a blocked isocyanate will become spontaneously unblocked and react with an available nucleophile and the viscosity will rise. Blocked isocyanates may enable long shelf life with low viscosity by blocking the reaction of the isocyanate with the present nucleophiles.

In some embodiments of the invention, the resin comprises at least about 50% of one or more acrylic monomers and about 0-45% of one or more acrylic-functionalized oligomers. The thiol-acrylate resin can be stored as a single pot system at room temperature. In some cases, the components of the resin can be combined and stored in a single pot (e.g., a suitable container for chemical storage) for at least 6 months at room temperature with no more than 10-20% increase in the viscosity of the resin.

Stabilized thiols may be any thiol that exhibits fewer ambient thermal reactions (e.g., nucleophilic substitution with monomers or oligomers) compared to other thiols. In some cases, the stabilized thiol includes a bulky side chain. Such bulky side chains may include at least one chemical group, such as a C1-C18 cyclic, branched, or straight alkyl, aryl, or heteroaryl group. In some cases, the stabilized thiol includes a secondary thiol. In other cases, the stabilized thiol includes a multi-functional thiol. In some cases, the stabilized thiol includes at least one of a difunctional, trifunctional, and/or tetrafunctional thiol. In some embodiments, the stabilized thiol includes at least one of a Pentaerythritol tetrakis (3-mercaptobutylate); and/or 1,4-bis (3-mercaptobutylyloxy) butane.

The thiol-acrylate photopolymerizable resin may demonstrate improved shelf-stability. Resin compositions containing thiols and non-thiol reactive species such as -enes and acrylates may undergo a dark reaction (i.e, an ambient thermal free-radical polymerization or Michael Addition), which reduces the shelf-life of these compositions. To account for lower shelf-life of these resins, they may either be stored under cold conditions or as a two-pot system. By contrast, thiol-acrylate resins such as those of the disclosed materials may include a stabilized thiol (e.g., a secondary thiol). The stabilized thiol may have decreased reactivity, which can potentially increase the shelf-life of 3D printable resin compositions and enable storage as a single-pot resin system at room temperature. Moreover, the resin remaining at completion of a 3D printing run may be reused in a subsequent run.

In some embodiments of the invention, the components of the resin mixture can be combined and stored in a single pot for at least 6 months at room temperature with no more than 10% increase in the viscosity of the resin. The increased shelf life, pot life end/or print life may be due, at least in part, to the presence of a stabilized thiol in the resin mixture. Resin compositions containing thiols and non-thiol reactive species, for example acrylates, can undergo a dark reaction (i.e, ambient thermal free-radical polymerizations or nucleophilic Michael additions). The stabilized thiol, however, may have reduced reactivity in the dark reaction.

In some cases, the resin may be configured for continuous use in a 3D printing operation in an air environment for a period of 2 weeks without an increase in viscosity of more than 10%. In some cases, the resin may be configured for continuous use in a 3D printing operation in an air environment for a period of 4 weeks without an increase in viscosity of more than 10%. In some cases, the resin may be configured for continuous use in a 3D printing operation in an air environment for a period of 10 weeks without an increase in viscosity of more than 10%. In some cases, the resin may be configured for continuous use in a 3D printing operation in an air environment for a period of 26 weeks without an increase in viscosity of more than 10%. In some cases, the resin may be configured for continuous use in a 3D printing operation in an air environment for a period of 1 year without an increase in viscosity of more than 10%.

In other cases, the at least one monomer and/or oligomer includes one or more acrylic monomers. In some embodiments, the one or more acrylic monomers are at least about 50% by weight of the resin. In other cases, the resin comprises less than about 5% of a stabilized thiol comprising one or more thiol functional groups, wherein the stabilized thiol may be configured to inhibit a nucleophilic substitution reaction between the one or more thiol functional groups and the one or more monomers or oligomers. The stabilized thiol may include at least one of a difunctional, trifunctional, and/or tetrafunctional thiol.

Another embodiment of the invention includes a photopolymerizable resin for additive manufacturing, the resin comprising: a blocked isocyanate; a crosslinking component; at least one monomer and/or oligomer; a photoinitiator, wherein the photoinitiator is configured to generate a free radical after exposure to light wherein the free radical initiates a chain reaction between the crosslinking component and the at least one monomer and/or oligomer to provide one or more polymer chains within a volume of the photopolymerizable resin; a chain transfer agent comprising at least one of a thiol, a secondary alcohol, and/or a tertiary amine, wherein the chain transfer agent is configured to reinitiate the chain reaction to provide one or more new polymer chains within a volume of the photopolymerizable resin, wherein a layer of the resin about 100 µm thick is configured to form a cured material in no more than 30 seconds; wherein the resin has a viscosity at room temperature of loss than 1,000 centipoise.

The cure rate of resin layers may depend on the tendency the resin components to polymerize by free radical reactions during curing by a light source (e.g., an ultraviolet light). The resin may optionally comprise a photoinitiator or inhibitor that may be used to speed or retard the curing process. A layer of resin of the disclosure, when provided in a thickness suitable for 3D printing or other additive manufacturing, may be able to photocure in time lengths desired for efficient production of an article. The cure rate may be such that a layer of the photopolymerizable resin about 100 µm thick is configured to cure in no more than 30 seconds. For example, in some cases, a layer of the resin about 100 µm thick may be configured to form a cured material in no more than 30 seconds, no more than 20 seconds, no more than 10 seconds, no more than 3 seconds, no more than 1 second, or no more than 1/10 of a second. In other cases, a layer of the resin about 400 µm thick may be configured to form a cured material in no more than 1 second. In other cases, a layer of the resin about 300 µm thick may be configured to form a cured material in no more than 1 second. In other cases, a layer of the resin about 200 µm thick may be configured to form a cured material in no more than 1 second. In other cases, a layer of the resin about 1000 µm thick may be configured to form a cured material in no more than 30 seconds. In other cases, a layer of the resin about 10 µm thick may be configured to form a cured material in no more than 2 seconds, no more than 1 seconds, no more than ½ a second, no more than ¼ of a second or no more than 1/10 of a second.

Another embodiment of the invention provides a photopolymerizable resin for additive manufacturing, the resin comprising: a blocked isocyanate; less than 5% of a thiol; at least about 50% of one or more monomers; and a photoinitiator, wherein the photoinitiator is configured to form a free radical after exposure to light, such that the free radical initiates growth of one or more polymer chains including at least the difunctional and monofunctional monomers; wherein the thiol is configured to promote continued growth of the one or more polymer chains, wherein the resin is configured to react by exposure to light to form a cured material, wherein the cured material has a glass transition temperature in the range about 5-30° C.

Additionally, the cured material is in a glassy state below the glass transition temperature, and the cured material is in a tough state above the glass transition temperature. In some cases, a tough state occurs in the range about 5-50° C. In some cases, the tough state occurs in the range about 20-40° C. In some cases, the resin has a glass transition temperature is in the range about 20-25° C.

The materials may have a strain at break greater than 100%, up to 1000%. The materials may have a toughness of between about 30 MJ/m$^3$ and about 100 MJ/m$^3$. In specific cases, the cured material has a strain at break in the range about 400-500% at about 20° C. In some cases, the cured material has a glass transition temperature in the range about 10-30° C. In some cases, the cured material has a Shore A hardness of about 30 at about 20° C. In some cases, the cured material has a Shore A hardness of about 19 at about 20° C. In some cases, the cured material in the tough state has a toughness in the range about 3-30 MJ/m$^3$. In some embodiments, the cured material in the tough state has a toughness in the range about 30-100 MJ/m$^3$. In some cases, the cured material in the glassy state has an elastic modulus less than 5 GPa, greater than 2 Pa, or greater than 1 GPa. In some cases, the cured material in the glassy state has an elastic modulus between 2 and 5 GPa. These material properties may be controlled through the crosslinking density of the system and the crystallinity percentage. The crosslinks may enable the ultimate strain while the crystals reinforce the matrix, providing higher strength and longer elongation before break.

Another embodiment of the invention provides a photopolymerizable resin for additive manufacturing, the resin comprising: a blocked isocyanate; less than about 5% of a thiol; and at least about 50% of one or more monomers; wherein the resin is configured to react to form a cured material; wherein the cured material has a toughness in the range about 3-30 MJ/m$^3$ and a strain at break ranging in the range about 30-300%.

In some cases, the thiol is about 0.5% to 4.0% by weight of the resin, about 4.0% to 4.7% by weight of the resin, about 4.7% to 4.99% by weight of the resin, or about 4.99-5% by weight of the resin.

In some cases, the cured material has a toughness in the range about 8-15 MJ/m$^3$ or less than about 1 MJ/m$^2$. In some cases, the cured material has a strain at break in the range about 50-250%, in some cases, the cured material has a glass transition temperature in the range about 10-30° C.

Some embodiments of the invention provides a photopolymerizable resin for additive manufacturing, the resin comprising: a blocked isocyanate; less than about 5% of a thiol; and at least about 60% of one or more monomers, wherein the resin is configured to react by exposure to light to form a cured material; wherein the cured material has a toughness in the range about 3-100 MJ/m$^3$ and a strain at break in the range about 200-1000%.

Another embodiments of the invention provides a photopolymerizable resin for additive manufacturing, the resin comprising: a blocked isocyanate; at least at least one monomer and/or oligomer; and less than about 20% of a thiol, wherein the resin is configured to react by exposure to light to provide a cured material, wherein the cured material produces less than 1 part per 100 million of thiol volatiles at ambient temperature and pressure over 50 seconds in an oxygen environment.

Although thiols have a bad odor, the thiol-acrylate resin may have little to no discernable smell. It is thought that the low-smell characteristic results, at least in part, from the use of high molecular weight thiols in less than stoichiometric amounts to reduce or eliminate thiol odor. Further, the thiol may become almost completely incorporated into the polymer network.

Thiol volatiles may result from cured materials or during manufacturing processes that use thiols. The thiol volatiles may be tailored to be below thresholds detectable to human scent. This may be achieved, for example, by the resin comprising less than about 5% of a thiol. Thiol volatiles may be measured in a sample by use of a gas chromatography mass spectrometer (GC-MS). In some cases, the cured material produces less than 1 part per 100 million of thiol volatiles at ambient temperature and pressure over 50 seconds in an oxygen environment. In some cases, the cured material produces less than 1 part per 10 billion of thiol volatiles at ambient temperature and pressure over 50 seconds in an oxygen environment. In some cases, the cured material produces less than 1 part per 1 billion of thiol volatiles at ambient temperature and pressure over 50 seconds in an oxygen environment. In some embodiments, the cured material produces less than 1 part per 10 billion of thiol volatiles at ambient temperature and pressure over 50 seconds in an oxygen environment.

The at least one monomer and/or oligomer and the thiol used for additive manufacturing may be any monomer and/or oligomer or thiol compound as described for the resin of the disclosure. For example, the at least one monomer and/or oligomer includes an alkene, an alkyne, an acrylate or acrylamide, methacrylate, epoxide, maleimide, and/or isocyanate.

In some cases, the thiol has a molecular weight greater than about 200 or greater than about 500. In some embodiments, the thiol has a molecular weight greater than about 100 and contains moieties including hydrogen bond acceptors and/or hydrogen bond donors, wherein said moieties undergo hydrogen bonding.

In some cases, the resin includes the thiol and the at least one monomer and/or oligomer in about a stoichiometric ratio. In other embodiments, the thiol is less than about 20% by weight of the resin, less than about 10% by weight of the resin, or less than about 5% by weight of the resin.

In other cases, the thiol includes an ester-free thiol. In some embodiments, the thiol includes a hydrolytically stable thiol. In some embodiments, the thiol includes a tertiary thiol.

Another embodiment of the invention provides a photopolymerizable resin for additive manufacturing, the resin comprising: a blocked isocyanate; less than about 5% of a thiol; at least about 50% of one or more acrylic monomers; and less than about 45% of one or more acrylic-functionalized oligomers, wherein the resin is configured to react by exposure to light to form a cured material; wherein the resin has a viscosity at room temperature of less than 1,000 cP; wherein the components of the resin can be combined and stored in a single pot for at least 6 months at room temperature with no more than 2%, 5%, 10%, 25%, 50% or 100% increase in the viscosity of the resin.

Another embodiment includes, a photopolymerizable resin for additive manufacturing, the resin comprising: a blocked isocyanate; less than about 5% of a stabilized thiol; at least 50% of one or more acrylic monomers; and less than about 45% of one or more acrylic-functionalized oligomers, wherein the resin is configured to react by exposure to light to form a cured material; wherein the components of the resin can be combined and stored in a single pot for at least 6 months at room temperature with no more than with no more than 2%, 5%, 10%, 25%, 50% or 100% increase in the viscosity of the resin. In some cases, the resin is configured to form a cured material in an aerobic environment.

Another embodiment of the invention includes a photopolymerizable resin for additive manufacturing comprising: a blocked isocyanates; less than about 5% of a stabilized thiol; and at least about 50% of one or more monomers; wherein the resin is configured to react by exposure to light to form a cured material, wherein a layer of the resin about 100 μm thick is configured to form a cured material in no more than 30 seconds; wherein the cured material has a toughness in the range about 3-100 $MJ/m^3$ and a strain at break in the range about 30-1000%.

Additive Manufacturing of Resins

A photopolymerizable resin for additive manufacturing can be prepared in accordance with the following procedure.

Resins can be printed in a Top-Down, DLP printer (such as the Octave Light R1), in open atmosphere and ambient conditions. The printing vat may be loaded with Z-fluid (usually, 70-95% of the total volume), and then printing resin is put atop the Z-fluid (in commensurate levels; i.e. 5-30%). Printing parameters are input into the controlling software: exposure time (which usually ranges from 0.1-20 seconds), layer height (which usually ranges from 10-300 micrometers), and the surface is recoated between each layer in 0.25-10 seconds. A computer-aided design ("CAD") file is loaded into the software, oriented and supported as necessary, and the print is initiated. The print cycle is: the build-table descends to allow the resin to coat the surface, ascends to a layer-height (also called the Z-axis resolution) below the resin surface, the recoater blade smoothes the surface of the resin, and the optical engine exposes a mask (cross-sectional image of the printed part, at the current height) causing the liquid resin to gel. The process repeats, layer by layer, until the article is finished printing. In some embodiments, the 3D printed resin parts are post-processed by curing at a temperature between 0-100° C. for between 0 to 5 hours under UV irradiation of 350-400 nm.

Material Characterization Techniques

The photopolymerizable resins for additive manufacturing can be characterized by use of the following techniques.

Tensile Testing

Uniaxial tensile testing is performed on a Lloyd instruments LR5K Plus Universal Testing Machine with a Laserscan 200 laser extensometer. Test specimens of cured material are prepared, with dimensions in accordance with ASTM standard D638 Type V. The test specimen is placed in the grips of the testing machine. The distance between the ends of the gripping surfaces is recorded. After setting the speed of testing at the proper rate, the machine is started. The load-extension cure of the specimen is recorded. The load and extension at the moment of rupture is recorded. Testing and measurements are performed in accordance with ASTM D638 guidelines.

Toughness

Toughness is measured using an ASTM D638 standard tensile test as described above. The dimensions of the Type V dogbone specimen may be as follows:

Width of narrow section (W)=3.18±0.03 mm;
Length of narrow section (L)=9.53±0.08 mm;
Gage length (G)=7.62±0.02 mm;
Radius of fillet (R)=12.7±0.08 mm Tensile testing may be performed using a speed of testing of 100 mm/min. For each test, the energy required to break can be determined from the area under the load trace up to the point at which rupture occurred (denoted by sudden load drop). This energy is then calculated to obtain the toughness ($MJ/m^3$)

Strain at Break

Strain at break can be measured using an ASTM D638 standard tensile test as described above. The dimensions of the Type V dogbone specimen may be as follows:

Width of narrow section (W)=3.18±0.03 mm;
Length of narrow section (L)=9.53±0.08 mm;
Gage length (G)=7.62±0.02 mm;
Radius of fillet (R)=12.7±0.08 mm Tensile testing may be performed using a speed of testing of 100 mm/min. For each test, the extension at the point of rupture is divided by the original grip separation (i.e. the distance between the ends of the gripping surfaces) and multiplied by 100.

Differential Scanning Calorimetry

Differential scanning calorimetry (DSC) measurements can be performed on a Mettler Toledo DSC-1. A test specimen of 3-10 mg of cured material is placed in the sample holder. Testing is conducted in a 40 ml/min nitrogen purge gas atmosphere at a temperature variation of 10°0 C./min for three heat-cool cycles. Glass Transition Temperature (Tg) may be measured via a straight line approximation of the mid-point between the on-set and off-set of the glass transition slopes. DSC testing is performed in accordance with ASTM E1356 Guidelines.

Dynamic Mechanical Analysis (DMA)

Dynamic Mechanical Analysis (DMA) measurements are performed on a Mettler Toledo DMA-861. A test specimen of cured material 12 mm long, 3 mm wide, and 0.025-1.0 mm thick is used. The specimen is subjected to a tensile force at 1 Hz with a maximum amplitude of 10 N and a maximum displacement of 15 μm. Glass Transition Temperature (Tg) is measured as the peak of Tan Delta (the ratio of the loss and storage moduli). DMA testing is performed in accordance with ASTM D4065 guidelines.

Cure Rate

A sample of a given resin (approx. 1 g-10 g) is placed into a container. The container is placed below an optical engine, so that the resin is directly in the center of the projection area. A sample image (e.g. a 1 cm×1 cm square) is projected onto the resin for a given amount of time (usually 0.1-20 seconds). The amount of time for an initial exposure is determined. The surface of the resin sample is inspected to determine if a gel has formed. If a manipulable gel with fixed geometry (viz. a square) has not formed, a new sample is generated with increased exposure time, and the test is repeated until a gel is successfully formed from a single exposure to approximate of the gelation point. The Depth of Cure (DOC) recorded is the exposure time required for gelation.

Hardness

Hardness is obtained using a Shore A Durometer (1-100 HA±0.5 HA) in accordance with ASTM D2240 guidelines.

Viscosity

Viscosity (mPa·s) may be obtained using a Brookfield LV-1 viscometer in accordance with ASTM D2196 guidelines.

What is claimed is:

1. A photopolymerizable resin for additive manufacturing, the resin comprising:
   a blocked isocyanate;
   30-90% by weight of one or more acrylic monomers; and
   a multifunctional nucleophile;
   wherein the resin is configured to react by exposure to light to form a cured material, and
   wherein, after a post-cure heat treatment, the cured material has a strain capacity of between about 10% and about 500%.

2. The photopolymerizable resin according to claim 1, further comprising one or more includes an a thiol monomers or -ene monomers.

3. The photopolymerizable resin according to claim 1, wherein the multifunctional nucleophile includes at least one of a multifunctional alcohol, a multifunctional thiol, or a multifunctional amine.

4. The photopolymerizable resin according to claim 3, wherein the multifunctional nucleophile includes a multifunctional thiol.

5. The photopolymerizable resin according to claim 4, wherein the multifunctional thiol has a molecular weight greater than about 100 daltons.

6. The photopolymerizable resin according to claim 4, wherein the resin includes about 1-20% of a multifunctional thiol.

7. The photopolymerizable resin according to claim 4, wherein the multifunctional thiol includes a difunctional thiol.

8. The photopolymerizable resin according to claim 4, wherein the multifunctional thiol includes a secondary thiol.

9. The photopolymerizable resin according to claim 8, wherein the secondary thiol includes at least one of Pentaerythritol tetrakis (3-mercaptobutylate); 1,4-bis (3-mercaptobutylyloxy) butane; or 1,3,5-Tris(3-mercaptobutyloxethyl)-1,3,5,-triazine.

10. The photopolymerizable resin according to claim 1, wherein the resin includes 1-70% of a blocked isocyanate.

11. The photopolymerizable resin according to claim 1, wherein the blocked isocyanate includes at least one of a uretdione, a biuret, an allophanate, an isocyanaurate, methylene dicyclohexyl diisocyanate (MDI), or toluene diisocyanate (TDI).

12. The photopolymerizable resin according to claim 8, wherein the uretdione is a uretdione of hexamethylene diisocyanate (HDI), a uretdione of isophorone diisocyanate (IDI), a uretdione of methylene dicyclohexyl diisocyanate (MDI), a uretdione of hydrogenated methylene dicyclohexyl diisocyanate (HMDI), or a uretdione of toluene diisocyanate (TDI).

13. The photopolymerizable resin according to claim 11, wherein the isocyanaurate is an isocyanaurate of hexamethylene diisocyanate (HDI), an isocyanaurate of isophorone diisocyanate (IDI), an isocyanaurate of methylene dicyclohexyl diisocyanate (MDI), an isocyanaurate of hydrogenated methylene dicyclohexyl diisocyanate (HMDI), or an isocyanaurate of toluene diisocyanate (TDI).

14. The photopolymerizable resin according to claim 11, wherein the biuret is a biuret of hexamethylene diisocyanate (HDI), a biuret of isophorone diisocyanate (IDI), a biuret of methylene dicyclohexyl diisocyanate (MDI), a biuret of hydrogenated methylene dicyclohexyl diisocyanate (HMDI), or a biuret of toluene diisocyanate (TDI).

15. The photopolymerizable resin according to claim 1, wherein the blocked isocyanate includes an isocyanate and a blocking agent.

16. The photopolymerizable resin according to claim 15, wherein the blocking agent includes at least one of a nucleophile, a derivative of an alcohol, a hindered amine, a caprolactam, a phenol, an oxime, or a pyrazole malonate.

* * * * *